(12) United States Patent
Kunimoto et al.

(10) Patent No.: US 11,975,519 B2
(45) Date of Patent: May 7, 2024

(54) METHOD OF MANUFACTURING PLATE-LIKE MEMBER AND LAMINATE

(71) Applicant: NIPPON ELECTRIC GLASS CO., LTD., Otsu (JP)

(72) Inventors: Tomomichi Kunimoto, Otsu (JP); Hideki Asano, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 17/263,191

(22) PCT Filed: Oct. 25, 2019

(86) PCT No.: PCT/JP2019/041825
§ 371 (c)(1),
(2) Date: Jan. 26, 2021

(87) PCT Pub. No.: WO2020/100552
PCT Pub. Date: May 22, 2020

(65) Prior Publication Data
US 2021/0187929 A1 Jun. 24, 2021

(30) Foreign Application Priority Data
Nov. 15, 2018 (JP) .................. 2018-214315

(51) Int. Cl.
*B32B 38/00* (2006.01)
*B32B 3/04* (2006.01)
(Continued)

(52) U.S. Cl.
CPC ............ *B32B 38/0004* (2013.01); *B32B 3/04* (2013.01); *B32B 3/30* (2013.01); *B32B 7/12* (2013.01);
(Continued)

(58) Field of Classification Search
CPC ......... B32B 38/0004; B32B 3/04; B32B 3/30; B32B 7/12; B32B 17/10; B32B 27/32;
(Continued)

(56) References Cited

U.S. PATENT DOCUMENTS 3,396,452 A * 8/1968 Sato ..................... B28D 5/0052
438/464
5,303,861 A * 4/1994 Allaire .................. C03B 33/033
225/2
(Continued)

FOREIGN PATENT DOCUMENTS

CN 108138013 A 6/2018
JP 05-074931 A 3/1993
(Continued)

OTHER PUBLICATIONS

JP2014083821A Machine Translation of Description (Year: 2021).*
(Continued)

*Primary Examiner* — Cynthia L Schaller
(74) *Attorney, Agent, or Firm* — Keating & Bennett, LLP

(57) ABSTRACT

Provided is a method of manufacturing plate-like members whereby shape defects in the plate-like members can be prevented to increase production yield and a laminate for use in the method of manufacturing plate-like members. A method of manufacturing a plurality of plate-like members by breaking a base material 11 for plate-like members into segments includes the steps of: preparing a base material 11 for plate-like members having a first principal surface 11a and a second principal surface 11b opposed to each other; forming a breaking groove 12a, 13a in the first principal surface 11a of the base material 11 for plate-like members; bonding a support film 14 to the second principal surface 11b of the base material 11 for plate-like members; bonding an adhesive film 17 to the first principal surface 11a of the base material 11 for plate-like members to cover the first principal (Continued)

surface 11*a* of the base material 11; and breaking the base material 11 for plate-like members into segments along the breaking groove 12*a*, 13*a* by pressing, through the support film 14 and with the adhesive film 17 bonded to the base material 11 for plate-like members, a region of the base material 11 for plate-like members where the breaking groove 12*a*, 13*a* is formed.

16 Claims, 4 Drawing Sheets

(51) Int. Cl.
    *B32B 3/30*     (2006.01)
    *B32B 7/12*     (2006.01)
    *B32B 17/10*     (2006.01)
    *B32B 27/32*     (2006.01)
    *B32B 37/12*     (2006.01)

(52) U.S. Cl.
    CPC .............. *B32B 17/10* (2013.01); *B32B 27/32* (2013.01); *B32B 37/12* (2013.01); *B32B 2305/30* (2013.01); *B32B 2307/422* (2013.01); *B32B 2457/00* (2013.01)

(58) Field of Classification Search
    CPC ................ B32B 37/12; B32B 2305/30; B32B 2307/422; B32B 2457/00; G02B 5/20; H01L 33/50
    See application file for complete search history.

(56) References Cited

U.S. PATENT DOCUMENTS

| | | | | |
|---|---|---|---|---|
| 5,304,418 | A * | 4/1994 | Akada | H01L 21/302 428/354 |
| 2008/0042153 | A1 * | 2/2008 | Beeson | H05B 33/10 257/94 |
| 2013/0295311 | A1 * | 11/2013 | Larson | C08L 63/00 156/60 |
| 2016/0185647 | A1 * | 6/2016 | Vogt | C03B 33/10 83/881 |
| 2017/0338118 | A1 * | 11/2017 | Yoshida | B23K 26/0608 |
| 2018/0281361 | A1 | 10/2018 | Oda et al. | |
| 2019/0280164 | A1 | 9/2019 | Kunimoto et al. | |

FOREIGN PATENT DOCUMENTS

| | | | |
|---|---|---|---|
| JP | 10-284443 | A | 10/1998 |
| JP | 2001-284292 | A | 10/2001 |
| JP | 2002-198327 | A | 7/2002 |
| JP | 2010-118401 | A | 5/2010 |
| JP | 2012185980 | A * | 9/2012 |
| JP | 2014003070 | A * | 1/2014 |
| JP | 2014083821 | A * | 5/2014 |
| JP | 2015-122402 | A | 7/2015 |
| JP | 2015209342 | A * | 11/2015 |
| JP | 2016-043505 | A | 4/2016 |
| JP | 2018-097060 | A | 6/2018 |
| KR | 10-2015-0044374 | A | 4/2015 |
| WO | WO-2016194746 | A1 * | 12/2016 ............. B28B 11/14 |

OTHER PUBLICATIONS

JP 05074931A Human Translation of Publication by LinguaLinx Language Solutions, Inc., Hedley Park Place, 433 River Street, Troy, NY (Year: 2022).*
JP2012185980A Machine Translation of Description (Year: 2023).*
JP2014003070A Machine Translation of Description (Year: 2023).*
JP2015209342A Machine Translation of Description (Year: 2023).*
WO-2016194746-A1 Machine Translation of Description (Year: 2023).*
Official Communication issued in International Patent Application No. PCT/JP2019/041825, dated Jan. 21, 2020.
Official Communication issued in corresponding Chinese Patent Application No. 201980054256.1, mailed on Mar. 9, 2024.

* cited by examiner

[FIG. 1.]
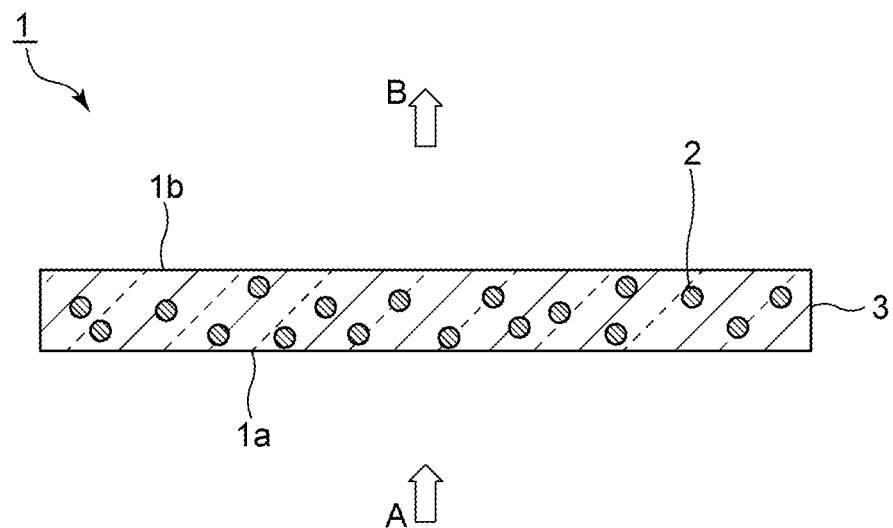
[FIG. 2.]
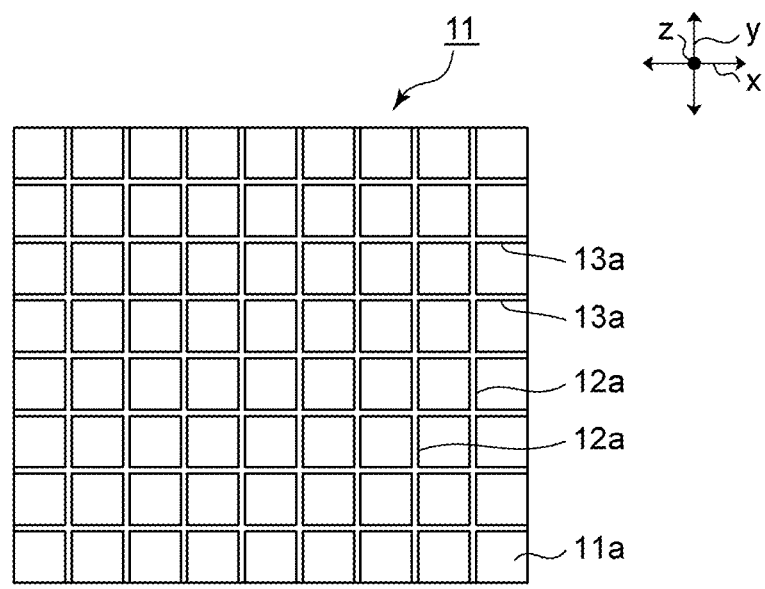

[FIG. 3.]
(a)
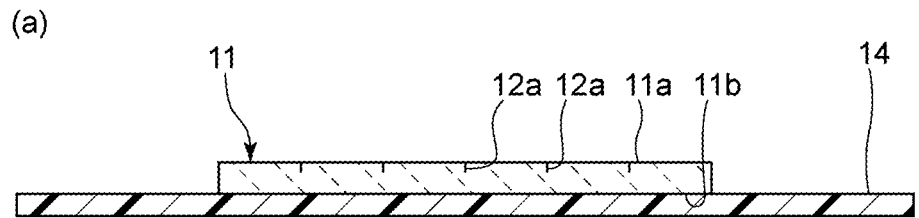
(b)
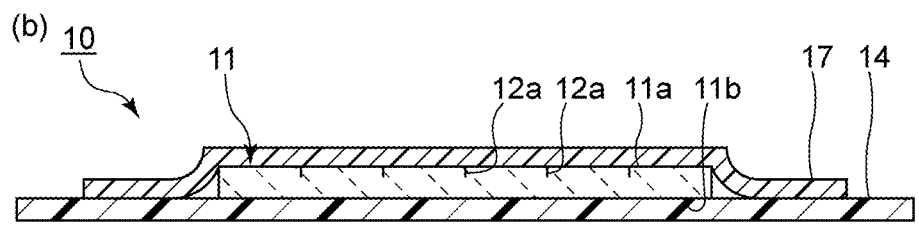
[FIG. 4.]
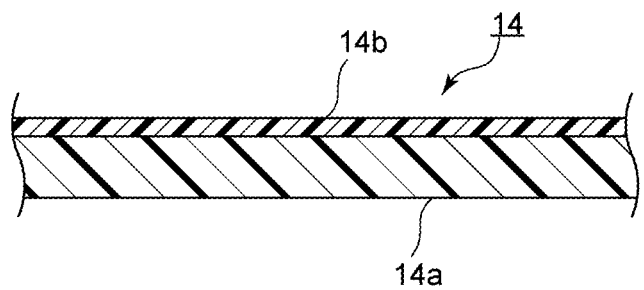
[FIG. 5.]
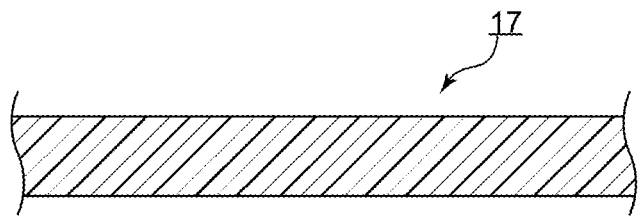
[FIG. 6.]
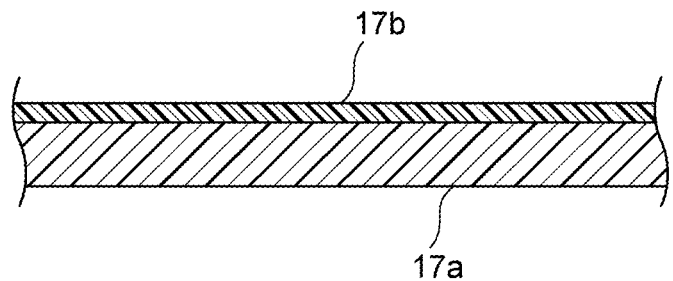

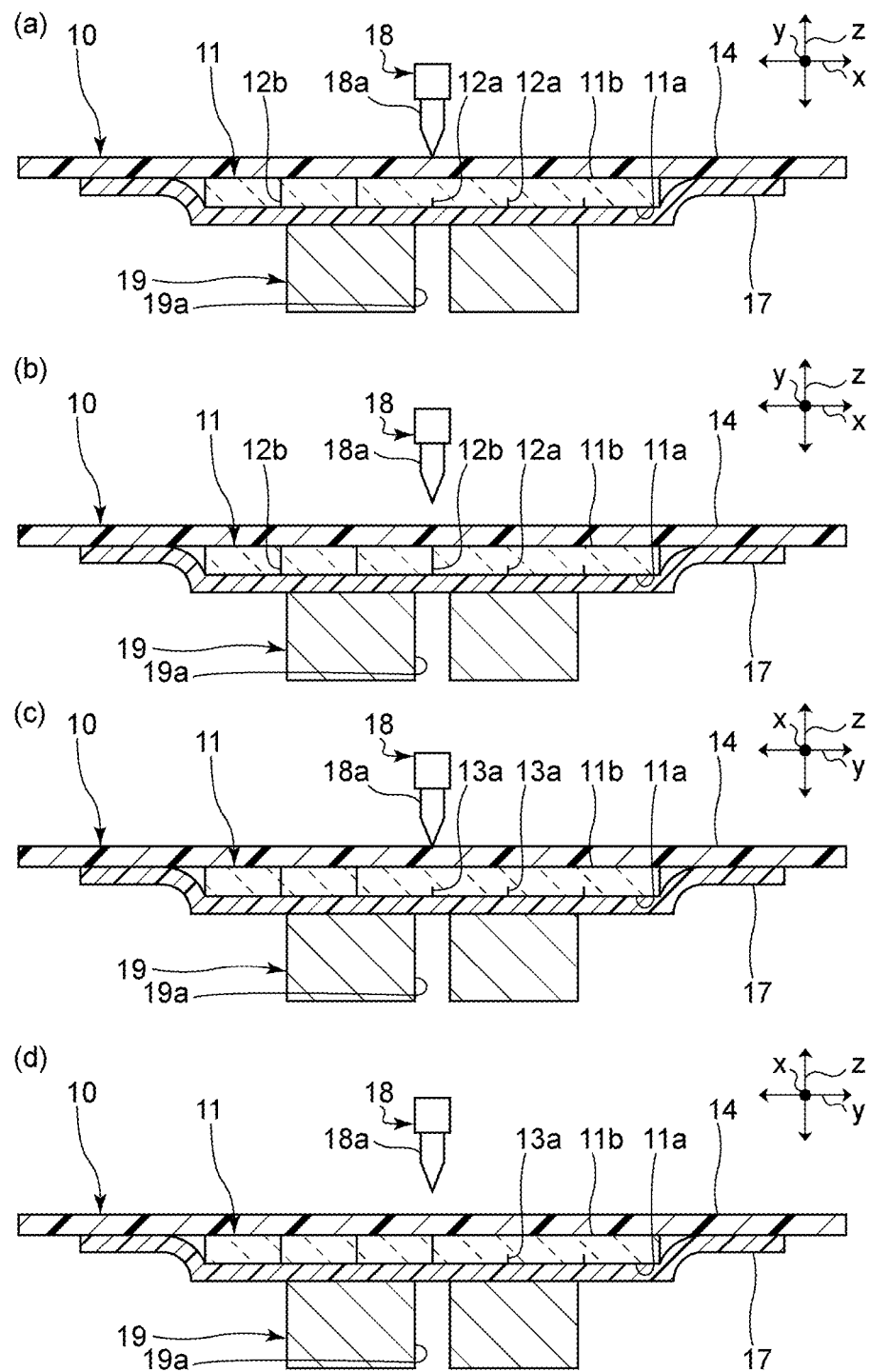
[FIG. 7.]

[FIG. 8.]
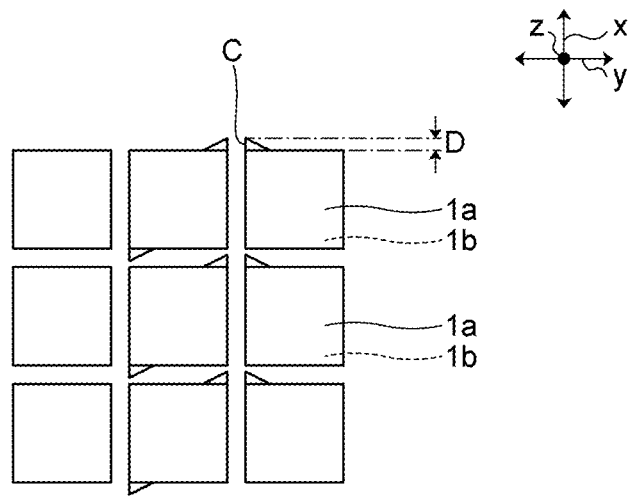
[FIG. 9.]
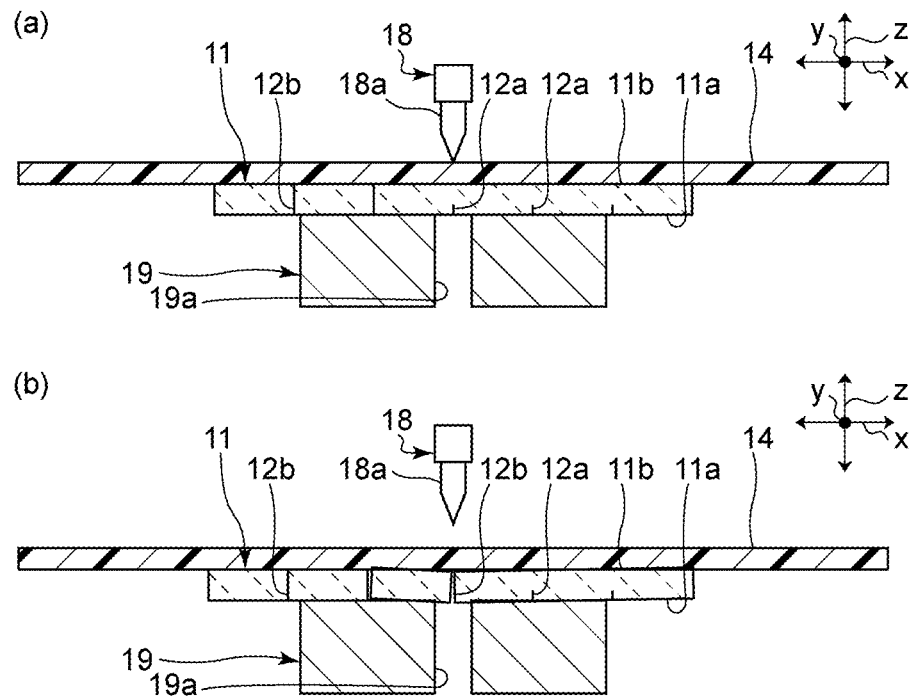

METHOD OF MANUFACTURING PLATE-LIKE MEMBER AND LAMINATE

TECHNICAL FIELD

The present invention relates to methods of manufacturing plate-like members, such as wavelength conversion members, and laminates for use in the methods of manufacturing plate-like members.

BACKGROUND ART

Recently, attention has been increasingly focused on light-emitting devices and the like using LEDs or LDs, as next-generation light sources to replace fluorescence lamps and incandescent lamps. As an example of such a next-generation light source, there is a disclosure of a light-emitting device in which an LED capable of emitting a blue light is combined with a wavelength conversion member capable of absorbing part of the light from the LED to convert it to a yellow light. This light-emitting device emits a white light which is a synthesized light of the blue light emitted from the LED and having passed through the wavelength conversion member and the yellow light emitted from the wavelength conversion member.

As a method of manufacturing a wavelength conversion member, there may be adopted a method of dividing a base material for a wavelength conversion member into segments to obtain a plurality of wavelength conversion members at one time. Patent Literature 1 below describes, as an example of such a method of manufacturing wavelength conversion members, a method for obtaining a plurality of wavelength conversion members by forming breaking grooves in a grid-like pattern in a base material for wavelength conversion members and breaking the base material into segments along the breaking grooves. This segmentation is implemented by breaking the base material for wavelength conversion members into parts along the breaking grooves extending in one direction of the grid-like pattern and then breaking the parts into smaller parts along the breaking grooves extending in the other direction of the grid-like pattern.

CITATION LIST

Patent Literature

[PTL 1]
JP-A-2018-097060

SUMMARY OF INVENTION

Technical Problem

In the above-described segmentation of a base material for plate-like members, such as wavelength conversion members, cracks are formed to originate at the breaking grooves and extend in the thickness direction of the base material for plate-like members and, thus, the base material for plate-like members is broken into parts. However, cracks may be produced which originate at the breaking grooves and extend in directions deviating from the above thickness direction. Therefore, shape defects, such as burrs, may be formed in the plate-like members obtained by segmentation.

The present invention aims at providing: a method of manufacturing plate-like members whereby shape defects in the plate-like members can be prevented to increase production yield; and a laminate for use in the method of manufacturing plate-like members.

Solution to Problem

A method of manufacturing plate-like members according to the present invention is a method of manufacturing a plurality of plate-like members by breaking a base material for plate-like members into segments and includes the steps of: preparing abase material for plate-like members having a first principal surface and a second principal surface opposed to each other; forming a breaking groove in the first principal surface of the base material for plate-like members; bonding a support film to the second principal surface of the base material for plate-like members; bonding an adhesive film to the first principal surface of the base material for plate-like members to cover the first principal surface of the base material; and breaking the base material for plate-like members into segments along the breaking groove by pressing, through the support film and with the adhesive film bonded to the base material for plate-like members, a region of the base material for plate-like members where the breaking groove is formed.

The breaking groove preferably comprises a first breaking groove and a second breaking groove intersecting each other and the step of breaking the base material into segments preferably includes: a first breaking step of breaking the base material for plate-like members into separate parts along the first breaking groove; and a second breaking step of breaking, after the first breaking step, the base material for plate-like members into separate parts along the second breaking groove. In this case, the first breaking groove and the second breaking groove preferably intersect at right angles.

In the step of breaking the base material into segments, the base material for plate-like members is preferably broken into segments along the breaking groove by pressing the base material for plate-like members through the support film with a pressing member extending in parallel with the first principal surface of the base material for plate-like members and linearly. In this case, in the step of breaking the base material into segments, the base material for plate-like members is preferably broken into segments along the breaking groove by pressing, with the base material for plate-like members supported through the adhesive film by a support member having a slit, the base material for plate-like members through the support film with the pressing member to apply pressure to the base material for plate-like members from both sides with the support member and the pressing member.

The support film preferably has a larger area than the second principal surface of the base material for plate-like members in plan view and, in bonding the adhesive film to the first principal surface of the base material for plate-like members to cover the first principal surface of the base material, the adhesive film is preferably bonded across the first principal surface to the support film.

The adhesive film is preferably a film having a self-adhesiveness.

It is preferred that an adhesive layer is provided on a surface of the support film and the adhesive layer of the support film is bonded to the second principal surface of the base material for plate-like members.

The adhesive film preferably has a lower adhesive strength than the support film.

The plate-like members may be wavelength conversion members in which phosphor particles are dispersed in an inorganic matrix.

A laminate according to the present invention is a laminate for use in manufacturing a plurality of plate-like members by breaking a base material for plate-like members into segments, and includes: a base material for plate-like members, the base material having a first principal surface and a second principal surface opposed to each other and provided with a breaking groove in the first principal surface; a support film bonded to the second principal surface of the base material for plate-like members; and an adhesive film bonded to the first principal surface of the base material for plate-like members to cover the first principal surface of the base material.

Advantageous Effects of Invention

The present invention enables provision of: a method of manufacturing plate-like members whereby shape defects in the plate-like members can be prevented to increase production yield; and a laminate for use in the method of manufacturing plate-like members.

BRIEF DESCRIPTION OF DRAWINGS

FIG. 1 is a schematic frontal cross-sectional view showing an example of a plate-like member manufactured by a method of manufacturing plate-like members according to the present invention.

FIG. 2 is a schematic plan view showing a base material for plate-like members which is for use in the method of manufacturing plate-like members according to one embodiment of the present invention and in which first breaking grooves and second breaking grooves are formed.

FIGS. 3(a) and 3(b) are schematic frontal cross-sectional views for illustrating the process for producing a laminate in the method of manufacturing plate-like members according to the one embodiment of the present invention.

FIG. 4 is a schematic enlarged frontal cross-sectional view of a support film for use in the method of manufacturing plate-like members according to the one embodiment of the present invention.

FIG. 5 is a schematic enlarged frontal cross-sectional view of an adhesive film for use in the method of manufacturing plate-like members according to the one embodiment of the present invention.

FIG. 6 is a schematic enlarged frontal cross-sectional view of a modification of an adhesive film for use in the method of manufacturing plate-like members according to the one embodiment of the present invention.

FIGS. 7(a) to 7(d) are schematic frontal cross-sectional views for illustrating the step of breaking the base material into segments in the method of manufacturing plate-like members according to the one embodiment of the present invention.

FIG. 8 is a schematic plan view showing examples of shape defects in plate-like members.

FIGS. 9(a) and 9(b) are schematic frontal cross-sectional views for illustrating a method of manufacturing plate-like members according to a comparative example.

DESCRIPTION OF EMBODIMENTS

Hereinafter, a description will be given of a preferred embodiment. However, the following embodiment is merely illustrative and the present invention is not limited to the following embodiment. Throughout the drawings, members having substantially the same functions may be referred to by the same reference characters.

(Plate-Like Member)

FIG. 1 is a schematic frontal cross-sectional view showing an example of a plate-like member manufactured by a method of manufacturing plate-like members according to the present invention. The plate-like member shown in FIG. 1 is a rectangular plate-like wavelength conversion member 1 having a first principal surface 1a and a second principal surface 1b opposed to each other. However, the shape of the wavelength conversion member 1 is not limited to the rectangular plate-like shape.

The wavelength conversion member 1 is formed so that phosphor particles 2 are dispersed in an inorganic matrix 3. The phosphor particles 2 emit fluorescence upon incidence of excitation light A. Therefore, when excitation light A is incident on the wavelength conversion member 1, a synthesized light B of the excitation light and the fluorescence is emitted from the wavelength conversion member 1.

The type of the phosphor particles 2 is not particularly limited so long as they can emit fluorescence upon incidence of excitation light. Specific examples of the type of the phosphor particles 2 include one or more selected from the group consisting of an oxide phosphor, a nitride phosphor, an oxynitride phosphor, a chloride phosphor, an oxychloride phosphor, a sulfide phosphor, an oxysulfide phosphor, a halide phosphor, a chalcogenide phosphor, an aluminate phosphor, a halophosphoric acid chloride phosphor, and a garnet-based compound phosphor. In using a blue light as the excitation light, for example, a phosphor capable of emitting a green light, a yellow light or a red light as fluorescence can be used.

The average particle diameter of the phosphor particles 2 is preferably 1 μm to 50 μm and more preferably 5 μm to 30 μm. If the average particle diameter of the phosphor particles 2 is too small, the luminescence intensity may decrease. On the other hand, if the average particle diameter of the phosphor particles 2 is too large, the luminescent color may be uneven.

The content of phosphor particles 2 in the wavelength conversion member 1 is preferably not less than 1% by volume, more preferably not less than 1.5% by volume, particularly preferably not less than 2% by volume, preferably not more than 70% by volume, more preferably not more than 50% by volume, and particularly preferably not more than 30% by volume. If the content of phosphor particles 2 is too small, it is necessary to increase the thickness of the wavelength conversion member 1 in order to obtain a desired luminescent color. This results in increased internal scattering of the resultant wavelength conversion member, which may decrease the light extraction efficiency. On the other hand, if the content of phosphor particles 2 is too large, it is necessary to decrease the thickness of the wavelength conversion member 1 in order to obtain the desired luminescent color, which may decrease the mechanical strength of the wavelength conversion member 1.

No particular limitation is placed on the type of inorganic material for use in the inorganic matrix 3 so long as it can be used as a dispersion medium for the phosphor particles 2, and an example that can be used is glass. Examples of the glass for use in the inorganic matrix 3 include a borosilicate-based glass, a phosphate-based glass, a tin-phosphate-based glass, and a bismuthate-based glass. Examples of the borosilicate-based glass include those containing, in terms of % by mass, 30% to 85% $SiO_2$, 0% to 30% $Al_2O_3$, 0% to 50%

$B_2O_3$, 0% to 10% $Li_2O+Na_2O+K_2O$, and 0% to 50% $MgO+CaO+SrO+BaO$. Examples of the tin-phosphate-based glass include those containing, in terms of % by mole, 30% to 90% SnO and 1% to 70% $P_2O_5$.

Referring to FIG. 1, a wavelength conversion member is shown as an example of the plate-like member manufactured by the method of manufacturing plate-like members according to the present invention, but the plate-like member is not limited to the wavelength conversion member. Examples of the plate-like member manufactured by the manufacturing method according to the present invention include, in addition to the wavelength conversion member, a brittle material substrate made of inorganic material, such as glass plate or ceramic plate, and a plate-like semiconductor device.

[Method of Manufacturing Plate-Like Members]

A description will be given below of an example of a method of manufacturing plate-like members according to one embodiment of the present invention. The plate-like member in this embodiment is the above-described plate-like wavelength conversion member.

(Process for Producing Laminate)

FIG. 2 is a schematic plan view showing a base material for plate-like members which is for use in the method of manufacturing plate-like members according to the one embodiment of the present invention and in which first breaking grooves and second breaking grooves are formed. FIGS. 3(a) and 3(b) are schematic frontal cross-sectional views for illustrating the process for producing a laminate in the method of manufacturing plate-like members according to the one embodiment of the present invention. FIG. 4 is a schematic enlarged frontal cross-sectional view of a support film for use in the method of manufacturing plate-like members according to the one embodiment of the present invention. FIG. 5 is a schematic enlarged frontal cross-sectional view of an adhesive film for use in the method of manufacturing plate-like members according to the one embodiment of the present invention.

First, a rectangular plate-like base material 11 for wavelength conversion members as shown in FIG. 2 is prepared. The base material 11 for wavelength conversion members has a first principal surface 11a and a second principal surface 11b opposed to each other (see FIG. 3(a)). The base material 11 for wavelength conversion members is formed so that phosphor particles are dispersed in an inorganic matrix. The base material 11 for wavelength conversion members can be made of the same material as the above-described wavelength conversion member 1. However, the base material for plate-like members may be, except for the base material 11 for wavelength conversion members, for example, a brittle material substrate made of inorganic material, such as glass plate or ceramic plate, or a plate-like semiconductor device.

Next, as shown in FIG. 2, breaking grooves are formed in the first principal surface 11a of the base material 11 for wavelength conversion members. Specifically, first breaking grooves 12a and second breaking grooves 13a intersecting each other are formed. In this embodiment, the first breaking grooves 12a intersect at right angles with the second breaking grooves 13a.

Now suppose that the directions extending in parallel with the first principal surface 11a of the base material 11 for wavelength conversion members and orthogonal to each other are the x direction and the y direction. Additionally, suppose that the direction orthogonal to the x direction and the y direction is the z direction. In this embodiment, the plurality of first breaking grooves 12a extend in the y direction and are located side by side in the x direction. On the other hand, the plurality of second breaking grooves 13a extend in the x direction and are located side by side in the y direction. However, the first breaking grooves 12a need not necessarily intersect at right angles with the second breaking grooves 13a. Furthermore, either the first breaking grooves 12a or the second breaking grooves 13a, but not both, may be provided. Alternatively, other breaking grooves different from the first breaking grooves 12a and the second breaking grooves 13a may be additionally provided.

In this embodiment, the pattern of the first breaking grooves 12a and the second breaking grooves 13a is formed in a grid-like manner. However, the pattern of the breaking grooves is not particularly limited and a pattern to meet the shape of finally manufactured plate-like members can be appropriately selected.

The depths of the first breaking grooves 12a and the second breaking grooves 13a are not particularly limited, but each of them is preferably in a range of 0.1% to 10% and more preferably in a range of 0.5% to 5% of the thickness of the base material 11 for wavelength conversion members. If the depth of the breaking grooves is too small, breaking along the breaking grooves may be difficult to achieve. If the depth of the breaking grooves is too large, the load for forming the breaking grooves becomes too large, so that cracks may develop in unintended directions, resulting in failure to break the base material into segments in a direction perpendicular to the first principal surface 11a.

The width of each of the first breaking grooves 12a and the second breaking grooves 13a is preferably not less than 0.001 mm, more preferably not less than 0.002 mm, preferably not more than 0.010 mm, and more preferably not more than 0.005 mm. If the width is too large, missing portions may occur during the breaking. If the width is too small, breaking along the breaking grooves may be difficult to achieve.

The first breaking grooves 12a and the second breaking grooves 13a are preferably formed by scribing. A specific method for forming the first breaking grooves 12a and the second breaking grooves 13a can be appropriately selected depending upon the material of the inorganic matrix. If the inorganic matrix is glass, the breaking grooves are preferably formed by a scriber or the like using diamond particles or the like. Alternatively, the first breaking grooves 12a and the second breaking grooves 13a may be formed by irradiation with laser light depending upon the material of the inorganic matrix.

Next, as shown in FIG. 3(a), a support film 14 is bonded to the second principal surface 11b of the base material 11 for wavelength conversion members. As shown in FIG. 4, the support film 14 includes: a support layer 14a; and an adhesive layer 14b provided on the support layer 14a.

In this embodiment, the support layer 14a is made of polyolefin film. However, no particular limitation is placed on the material for the support layer 14a and it can be made of any appropriate resin film. Furthermore, in this embodiment, the adhesive layer 14b is made of an ultraviolet curable resin. Examples of the ultraviolet curable resin that can be used include acrylic resins, epoxy resins, and polyurethane resins. However, the adhesive layer 14b may be made of, for example, any other resin and its material is not particularly limited. In this embodiment, by bonding the adhesive layer 14b of the support film 14 to the second principal surface 11b of the base material 11 for wavelength conversion members, the support film 14 can be bonded to the base material 11 for wavelength conversion members.

Next, as shown in FIG. 3(b), an adhesive film 17 is bonded to the first principal surface 11a of the base material 11 for wavelength conversion members to cover the first principal surface 11a of the base material 11. In this embodiment, the adhesive film 17 is bonded to the entire first principal surface 11a. In the present invention, the adhesive film 17 need only be bonded to part of the first principal surface 11a and need not necessarily be bonded to the entire first principal surface 11a. However, as will be described hereinafter, the adhesive film 17 is preferably bonded to the entire first principal surface 11a from the aspect of further preventing shape defects in the wavelength conversion members 1.

Furthermore, in this embodiment, the support film 14 has a larger area than the second principal surface 11b of the base material 11 for plate-like members in plan view. In addition, the adhesive film 17 is bonded across the first principal surface 11a of the base material 11 for wavelength conversion members to the support film 14. Therefore, the adhesive film 17 can be more certainly bonded firmly to the first principal surface 11a.

As shown in FIG. 5, the adhesive film 17 is a film which itself has adhesiveness. The adhesive strength of the adhesive film 17 to an adherend, such as a plate-like member, is preferably not less than 1 g/25 mm. The value of the adhesive strength can be measured based on JIS-Z-0237. In this embodiment, the adhesive film 17 is made of polyvinyl chloride. However, the adhesive film 17 may be made of any other resin.

Furthermore, the adhesive film 17 may include, as shown by a modification in FIG. 6, a backing material layer 17a and an adhesive layer 17b laid on top of the backing material layer 17a. Examples of the material that can be used as the backing material layer 17a include polyethylene terephthalate and polyvinyl chloride. The material for the adhesive layer 17b is not particularly limited and an appropriate adhesive, such as an acrylic pressure sensitive adhesive or a rubber pressure sensitive adhesive, can be used. The adhesive layer 17b may be made of an ultraviolet curable resin.

In this embodiment, particularly, a film having self-adhesiveness is used as the adhesive film 17. Self-adhesiveness refers to a nature that a film can adhere to an adherend by its own weight without the use of any other adhesive and without being pressed.

The adhesive strength of the adhesive film 17 is preferably not less than 3 g/25 mm, more preferably not less than 5 g/25 mm, still more preferably not less than 7 g/25 mm, yet still more preferably not less than 9 g/25 mm, even yet still more preferably not less than 11 g/25 mm, and particularly preferably not less than 13 g/25 mm. In this case, the adhesive film 17 can be more certainly bonded firmly to the first principal surface 11a.

The thickness of the adhesive film 17 is preferably 0.01 to 1 mm, more preferably 0.05 to 0.5 mm, and particularly preferably 0.1 to 0.2 mm. If the thickness of the adhesive film 17 is too small, the mechanical strength of the adhesive film 17 may be low, so that the base material 11 for wavelength conversion members may be damaged during the breaking step or the fixation of the base material 11 for wavelength conversion members may be insufficient. On the other hand, if the thickness of the adhesive film 17 is too large, the breaking accuracy decreases, so that shape defects in the plate-like members are likely to occur.

The adhesive strength of the adhesive film 17 is preferably lower than that of the support film 14. In this case, the adhesive film 17 can be more easily peeled off from the first principal surface 11a of the base material 11 for wavelength conversion members.

From the aspect of even more easily peeling off the adhesive film 17 from the first principal surface 11a of the base material 11 for wavelength conversion members, the adhesive strength of the adhesive film 17 is preferably not more than 100 g/25 mm, more preferably not more than 50 g/25 mm, and particularly preferably not more than 30 g/25 mm. Furthermore, it is preferred that, during peeling of the adhesive film 17 from the base material 11 for wavelength conversion members, no adhesive residue is left on the first principal surface 11a of the base material 11 for wavelength conversion members.

By bonding the adhesive film 17 to cover the first principal surface 11a of the base material 11 for wavelength conversion members in the above manner, a laminate 10 serving as an intermediate during manufacturing of wavelength conversion members 11 can be obtained.

(Breaking Step)

FIGS. 7(a) to 7(d) are schematic frontal cross-sectional views for illustrating the step of breaking the base material into segments in the method of manufacturing plate-like members according to the one embodiment of the present invention.

The step of breaking the base material into segments comprises a first breaking step shown in FIGS. 7 (a) and 7 (b) and a second breaking step shown in FIGS. 7(c) and 7(d). In the breaking steps in this embodiment, a pressing member 18 and a support 19 are used. The pressing member 18 includes a blade 18a extending in parallel with the first principal surface 11a of the base material 11 for wavelength conversion members and linearly. On the other hand, the support 19 has a slit 19a.

First, the first breaking step is performed. As shown in FIG. 7(a), the support 19 is placed in contact with the adhesive film 17. In doing so, the support 19 is placed so that when viewed from the adhesive film 17, the slit 19a coincides with a first breaking groove 12a along which breaking is to be done. On the other side of the base material 11, the pressing member 18 is placed at a position opposite the first breaking groove 12a along which breaking is to be done. At this time, each of the blade 18a of the pressing member 18 and the slit 19a of the support 19 extends linearly in the y direction.

Next, with the support 19 placed as described above, the base material 11 for wavelength conversion members is pressed through the support film 14 by the blade 18a of the pressing member 18. By applying pressure to the base material 11 for wavelength conversion members from both sides with the support 19 and the pressing member 18 in this manner, a crack originating at the first breaking groove 12a is developed in the thickness direction of the base material 11 for wavelength conversion members as shown in FIG. 7 (b). Thus, the base material 11 for wavelength conversion members is broken into separate parts along the first breaking groove 12a. At this time, broken cross-sections 12b are formed.

Next, the pressing member 18 and the support 19 are moved in the x direction and the base material 11 for wavelength conversion members is broken into separate parts along an adjacent first breaking groove 12a. By repeating the above procedure, the base material 11 for wavelength conversion member is broken into separate parts along all the first breaking grooves 12a located side by side in the x direction.

Next, the second breaking step is performed. As shown in FIG. 7 (c), in the second breaking step, each of the blade 18a of the pressing member 18 and the slit 19a of the support 19 is placed to extend linearly in the x direction. In the same manner as in the first breaking step, pressure is applied to the base material for plate-like members from both sides by the support 19 and the pressing member 18, so that, as shown in FIG. 7 (*d*), a crack originating at a second breaking groove 13*a* is developed in the thickness direction of the base material 11 for wavelength conversion members. Thus, the base material 11 for wavelength conversion members is broken into separate parts along the second breaking groove 13*a*.

Next, the pressing member 18 and the support 19 are moved in the y direction and the base material 11 for wavelength conversion members is broken into separate parts along an adjacent second breaking groove 13*a*. By repeating the above procedure, the base material 11 for wavelength conversion member is broken into separate parts along all the second breaking grooves 13*a* located side by side in the y direction. Thus, the base material 11 for wavelength conversion members is segmented into a plurality of wavelength conversion members 1.

Next, the adhesive film 17 is peeled off from the base material 11 for wavelength conversion members and the support film 14. Next, the support film 14 is irradiated with UV light, so that the adhesive layer 14*b* of the support film 14 is cured by ultraviolet radiation. Thereafter, the wavelength conversion members 1 forming segments are peeled off from the support film 14. As a result, the plurality of wavelength conversion members 1 are obtained.

This embodiment has a feature of including the breaking step of breaking the base material 11 for wavelength conversion members into segments along the breaking grooves with the adhesive film 17 bonded to the base material 11. Thus, shape defects in the wavelength conversion members 1 as plate-like members can be prevented to increase production yield. This will be described below by comparison between this embodiment and a comparative example. A manufacturing method according to the comparative example is different from this embodiment in that the adhesive film 17 is not used.

As a base material for wavelength conversion members, phosphor glass base plate (50 mm×50 mm×0.2 mm, phosphor concentration: 8.3% by volume) was prepared in which YAG phosphor powder is dispersed in a borosilicate-based glass matrix (softening point: 850° C.). By each of the manufacturing method according to this embodiment and the manufacturing method according to the comparative example, each using the above base material for wavelength conversion members, 2304 wavelength conversion members having a substantially square shape with a side length of approximately 1 mm were produced. A comparison was made of the incidence of shape defects between this embodiment and the comparative example. FIG. 8 below shows examples of shape defects.

FIG. 8 is a schematic plan view showing examples of shape defects in wavelength conversion members. FIG. 8 shows a state of a plurality of wavelength conversion members 1 before they are peeled off from a support film 14. As shown in FIG. 8, when viewed from the first principal surface 1*a* of a wavelength conversion member 1, a portion of the wavelength conversion member 1 where the outer peripheral edge of the second principal surface 1*b* protrudes beyond the outer peripheral edge of the first principal surface 1*a* is regarded as a burr C. The longest one of distances, in the area of the burr C, from the outer peripheral edge of the first principal surface 1*a* to the outer peripheral edge of the second principal surface 1*b* is defined as the size D of the burr C. If the size D of a burr is 20 μm or more, the wavelength conversion member is regarded as having a shape defect.

When wavelength conversion members 1 were manufactured by the manufacturing method according to the comparative example, the incidence of shape defects was 30%. In contrast, when wavelength conversion members were manufactured by the manufacturing method according to this embodiment (a polyvinyl chloride film with a thickness of approximately 0.12 mm and an adhesive strength of 13 g/25 mm was used as the adhesive film), the incidence of shape defects was 0%. It can be seen from the above that in this embodiment shape defects in wavelength conversion members 1 as plate-like members can be prevented to increase production yield. The reason for this can be attributed as follows.

As shown in FIG. 9(*a*), in the comparative example, the base material 11 for wavelength conversion members is broken into segmental parts along the first breaking grooves 12*a* in the same manner as in this embodiment except that the adhesive film 17 is not used. In the comparative example, segmental parts (reed-shaped segmental parts) of the base material 11 for wavelength conversion members during the first breaking step are pressed against each other on the support 19 and thus become easily movable, so that, as shown in FIG. 9(*b*), the segmental parts of the base material 11 for wavelength conversion members after the breaking may be misaligned with each other. In this case, unevenness occurs on the first principal surface 11*a* after the first breaking step. When in this state the second breaking step is performed, the direction of developments of cracks originating at the second breaking grooves 13*a* is likely to deviate from the thickness direction of the base material 11 for wavelength conversion members. Therefore, in the comparative example, shape defects due to burrs are likely to occur.

In contrast, in this embodiment, as shown in FIG. 3(*b*), a laminate 10 is formed which includes a support film 14, a base material 11 for wavelength conversion members, and an adhesive film 17 bonded to the support film 14 and the base material 11 for wavelength conversion members. Thereafter, the first breaking step is performed. Since, as shown in FIG. 7(*a*), the first breaking step is performed with the adhesive film 17 bonded to the first principal surface 11*a* of the base material 11 for wavelength conversion members, surrounding portions of the first breaking grooves 12*a* and surrounding portions of the broken cross-sections 12*b* can be effectively fixed in place during the breaking. Thus, when the base material 11 for wavelength conversion members is broken into segmental parts along the first breaking groove 12*a* to form broken cross-sections 12*b*, the segmental parts of the base material 11 for wavelength conversion members are less likely to be misaligned with each other around the broken cross-sections 12*b*. Therefore, it can be prevented that unevenness occurs on the first principal surface 11*a* of the base material 11 for wavelength conversion members after the first breaking step.

In this embodiment, the second breaking step shown in FIGS. 7 (*c*) and 7 (*d*) is performed in a state where substantially no unevenness occurs on the first principal surface 11*a* of the base material 11 for wavelength conversion members. Thus, during breaking of the base material 11 for wavelength conversion members into separate parts along the second breaking groove 13*a*, a crack originating at the second breaking groove 13*a* can be more certainly developed in the thickness direction of the base material 11 for wavelength conversion members. Therefore, the occurrence of shape defects can be effectively prevented to effectively increase production yield.

Furthermore, in this embodiment, during the first breaking step and the second breaking step, the first principal surface 11a of the base material 11 for wavelength conversion members is covered with the adhesive film 17. Thus, pressure can be applied to the base material 11 for wavelength conversion members from both sides by the support 19 and the pressing member 18 without contact of the support 19 with the base material 11 for wavelength conversion members. Therefore, the first principal surfaces 1a of the wavelength conversion members 1 obtained by segmentation are less likely to be scratched.

For the above reasons, it is preferred that, as in this embodiment, the entire surface of the base material 11 for wavelength conversion members is covered with the adhesive film 17 during the first breaking step and the second breaking step. Thus, in applying pressure to the base material 11 for wavelength conversion members from both sides, the first principal surface 11a can be more certainly protected. Hence, the first principal surfaces 1a of the wavelength conversion members 1 obtained by segmentation are even less likely to be scratched. In addition, during the first breaking step, surrounding portions of the first breaking grooves 12a and surrounding portions of the broken cross-sections 12b can be further fixed in place. Thus, during the second breaking step of breaking the base material 11 for wavelength conversion members into separate parts, misalignment of separate parts around the broken cross-sections 12b is even less likely to occur. Therefore, the occurrence of shape defects in the wavelength conversion members 1 as plate-like members can be further prevented.

In using the adhesive film 17 having self-adhesiveness, its portion adhering to the base material 11 for wavelength conversion members tends to be less likely to move in the direction of shear (the direction parallel to the first principal surface 11a of the base material 11 for wavelength conversion members). Thus, during the first breaking step, surrounding portions of the first breaking grooves 12a and surrounding portions of the broken cross-sections 12b can be more certainly fixed in place. Therefore, the occurrence of shape defects in the wavelength conversion members 1 as plate-like members can be even more certainly prevented.

[Laminate]

As shown in FIG. 3(b), the laminate 10 includes a base material 11 for wavelength conversion members, a support film 14, and an adhesive film 17. The laminate 10 is an intermediate during manufacturing of the above-described wavelength conversion members 1. However, the base material 11 for wavelength conversion members may be a base material for any other type of plate-like members. In other words, the laminate 10 may be an intermediate during manufacturing of plate-like members other than wavelength conversion members 1. Examples of the other type of plate-like members include a brittle material substrate made of inorganic material, such as glass plate or ceramic plate, and a plate-like semiconductor device. In these cases, the above-described base material for plate-like members can be used instead of the base material 11 for wavelength conversion members.

The base material 11 for wavelength conversion members has a rectangular plate-like shape having a first principal surface 11a and a second principal surface 11b opposed to each other. The first principal surface 11a is provided with first breaking grooves 12a and second breaking grooves 13a. The support film 14 is bonded to the second principal surface 11b. Furthermore, the adhesive film 17 is bonded to the first principal surface 11a to cover the first principal surface 11a. In this embodiment, the adhesive film 17 is bonded across the first principal surface 11a to the support film 14. However, in the present invention, the adhesive film 17 need only be bonded to part of the first principal surface 11a and need not necessarily be bonded to reach the support film 14. The same as those used in the above-described manufacturing method can be used as the support film 14, the base material 11 for wavelength conversion members, and the adhesive film 17.

When a plurality of plate-like members are manufactured by breaking a laminate 10 like described above into segments, as already described in the section relating to the above-described manufacturing method, the wavelength conversion members 1, which are resultant plate-like members, can be effectively prevented from producing shape defects and, thus, production yield can be effectively increased.

REFERENCE SIGNS LIST

1 . . . wavelength conversion member
1a . . . first principal surface
1b . . . second principal surface
2 . . . phosphor particle
3 . . . inorganic matrix
10 . . . laminate
11 . . . base material for wavelength conversion members
11a . . . first principal surface
11b . . . second principal surface
12a . . . first breaking groove
12b . . . broken cross-section
13a . . . second breaking groove
14 . . . support film
14a . . . support layer
14b . . . adhesive layer
17 . . . adhesive film
17a . . . backing material layer
17b . . . adhesive layer
18 . . . pressing member
18a . . . blade
19 . . . support
19a . . . slit

The invention claimed is:

1. A method of manufacturing a plurality of plate members by breaking a base material for plate members into segments, the method comprising the steps of:
preparing the base material for plate members having a first principal surface and a second principal surface opposed to each other;
forming a breaking groove in the first principal surface of the base material for plate members using a scriber including diamond particles;
bonding a support film to the second principal surface of the base material for plate members;
bonding an adhesive film to the first principal surface of the base material for plate members to cover the first principal surface of the base material; and
breaking the base material for plate members into segments along the breaking groove by pressing, through the support film and with the adhesive film bonded to the base material for plate members, a region of the base material for plate members where the breaking groove is formed; wherein
the adhesive film is a film having self-adhesiveness,
the plate members are wavelength conversion members in which phosphor particles are dispersed in an inorganic matrix, and the inorganic matrix is a glass, and
a width of the breaking groove is not less than 0.002 mm and not more than 0.005 mm.

2. The method of manufacturing plate members according to claim 1, wherein
the breaking groove comprises a first breaking groove and a second breaking groove intersecting each other, and
the step of breaking the base material into segments includes: a first breaking step of breaking the base material for plate members into separate parts along the first breaking groove; and a second breaking step of breaking, after the first breaking step, the base material for plate members into separate parts along the second breaking groove.

3. The method of manufacturing plate members according to claim 2, wherein the first breaking groove and the second breaking groove intersect at right angles.

4. The method of manufacturing plate members according to claim 1, wherein, in the step of breaking the base material into segments, the base material for plate members is broken into segments along the breaking groove by pressing the base material for plate members through the support film with a pressing member extending in parallel with the first principal surface of the base material for plate members and linearly.

5. The method of manufacturing plate members according to claim 4, wherein, in the step of breaking the base material into segments, the base material for plate members is broken into segments along the breaking groove by pressing, with the base material for plate members supported through the adhesive film by a support member having a slit, the base material for plate members through the support film with the pressing member to apply pressure to the base material for plate members from both the first and second principal surfaces with the support member and the pressing member.

6. The method of manufacturing plate members according to claim 1, wherein
the support film has a larger area than the second principal surface of the base material for plate members in plan view, and
in bonding the adhesive film to the first principal surface of the base material for plate members to cover the first principal surface of the base material, the adhesive film is bonded across the first principal surface to the support film.

7. The method of manufacturing plate members according to claim 1, wherein
an adhesive layer is provided on a surface of the support film, and
the adhesive layer of the support film is bonded to the second principal surface of the base material for plate members.

8. The method of manufacturing plate members according to claim 1, wherein the adhesive film has a lower adhesive strength than the support film.

9. The method of manufacturing plate members according to claim 1, wherein an adhesive strength of the adhesive film is not more than 100 g/25 mm.

10. The method of manufacturing plate members according to claim 1, wherein the adhesive film is made of polyvinyl chloride.

11. The method of manufacturing plate members according to claim 1, wherein a depth of the breaking groove is in a range of 0.1% to 5% of a thickness of the base material for wavelength conversion members.

12. The method of manufacturing plate members according to claim 1, wherein a thickness of the adhesive film is 0.01 mm to 1 mm.

13. The method of manufacturing plate members according to claim 1, further comprising:
irradiating the support film with UV light to cure an adhesive layer of the support film, and
peeling the segments of the base material for plate members from the support film.

14. The method of manufacturing plate members according to claim 1, wherein an average particle diameter of the phosphor particles is 1 μm to 50 μm.

15. The method of manufacturing plate members according to claim 1, wherein a content of the phosphor particles in the wavelength conversion member is not less than 1% by volume and not more than 50% by volume.

16. The method of manufacturing plate members according to claim 1, wherein the glass is a borosilicate-based glass, a phosphate-based glass, a tin-phosphate-based glass, or a bismuthate-based glass.

* * * * *